United States Patent

Ringh et al.

[11] Patent Number: 5,844,514
[45] Date of Patent: Dec. 1, 1998

[54] ANALOG-TO-DIGITAL CONVERTER AND SENSOR DEVICE COMPRISING SUCH A CONVERTER

[75] Inventors: Ulf Ringh, Rimforse; Christer Jansson, Linköping, both of Sweden

[73] Assignee: Forsvarets Forskningsanstalt, Stockholm, Sweden

[21] Appl. No.: 836,525
[22] PCT Filed: Oct. 31, 1995
[86] PCT No.: PCT/SE95/01287
  § 371 Date: Apr. 30, 1997
  § 102(e) Date: Apr. 30, 1997
[87] PCT Pub. No.: WO96/13903
  PCT Pub. Date: May 9, 1996

[30] Foreign Application Priority Data

Nov. 1, 1994 [SE] Sweden .................................. 9403736

[51] Int. Cl.[6] .................................................. H03M 1/12
[52] U.S. Cl. .............................................. 341/143; 341/118
[58] Field of Search ................................... 341/118, 120, 341/139, 155; 375/242, 237

[56] References Cited

U.S. PATENT DOCUMENTS 4,940,982  7/1990  Gulczynski ............................. 341/169
5,101,206  3/1992  Riedel ..................................... 341/156
5,196,853  3/1993  Abbiate et al. ......................... 341/143

FOREIGN PATENT DOCUMENTS 0 458 524  11/1991  European Pat. Off. .

*Primary Examiner*—Marc S. Hoff
*Assistant Examiner*—Peguy JeanPierre
*Attorney, Agent, or Firm*—Jacobson, Price, Holman & Stern, PLLC

[57] ABSTRACT

A periodically integrating analog-to-digital converter and a sensor device having such a converter. The analog-to-digital converter has a measured-value-to-pulse-amount converter, i.e., a sigma-delta converter of the first order that is reset to zero before each new period, and a digital counter for the number of feedback signals of known reference value in the measured-value-to-pulse-amount converter. This constitutes a rough measure of the input signal. The analog-to-digital converter also converts the residual value of the measured-value-to-pulse-amount converter at the end of the period to a digital value, and an adder which adds this value to the output signal from the digital counter, resulting in a more accurate measure of the input signal.

7 Claims, 4 Drawing Sheets

ANALOG-TO-DIGITAL CONVERTER AND SENSOR DEVICE COMPRISING SUCH A CONVERTER

BACKGROUND OF THE INVENTION

1. Field of the Invention

The present invention relates to an analog-to-digital converter and a sensor device including such a converter.

2. Description of Related Art

Digital technology dominates the field of signal processing in an increasing number of applications. However, the input signals involved are not always of digital origin, but may consist of analogue quantities which are sensed with the aid of sensors. In most cases, the sensors convert the measured signal to a current or a voltage. In the following, we will assume that we are dealing with a voltage, but the line of argument and the ideas put forth below may sometimes also be applied to a current, a charge or some other quantity. As the digital technology enables higher and higher calculation capacities, the interface between analogue and digital signal processing is moved closer and closer to the sensor, resulting in increased digital filtration instead of analogue filtration. Mostly, this means that higher requirements are placed on the bandwidth as well as on the resolution in the analog-to-digital conversion. Radio and radar are examples of this.

Imaging sensors are another example involving a large amount of data (HDTV), where it is a desideratum that the A/D conversion takes place close to the sensor. The resolution (dynamic range) and the bandwidth vary considerably according to the application. In uncooled infrared cameras, the requirements placed on the resolution are extremely high, fully on a par with those placed on audio products. At the same time, the bandwidth is in the video frequency range. However, it is very difficult to achieve A/D conversion involving high requirements on bandwidth and resolution, especially if one wishes to avoid expensive trimming of the converter.

A/D converters (ADC) providing a resolution that exceeds about 10 bits can be divided into two groups: pulse-modulating ADCs with built-in linearity and conventional ADCs in the need of expensive trimming.

In the group of conventional ADCs, there are many variants, such as flash, successive approximation (SA), algorithmic, single ramp, and so forth. What these variants all have in common is that the accuracy of the quantisation intervals is determined by the accuracy in the relationships between the components. Double-ramp variants are the exception, measuring time in order to integrate up to a certain level. However, double-ramp variants are unacceptably slow at a high resolution. The accuracy of a conventional ADC is often restricted by capacitance, transistor or resistance matching. The relative component matching in a chip with standard VLSI technology often results in an accuracy of approximately 8–10 bits. Enhanced precision requires additional trimming of the components afterwards, which costs extra. Part of the extra cost is due to the fact that use has to be made of process technology enabling trimming. As a result, conventional high-resolution ADCs become expensive. In addition, the accuracy is reduced as time goes on as a result of the ageing of the component parts.

In the group of pulse-modulating ADCs, there are different variants, such as voltage-to-frequency and sigma-delta. Like double-ramp ADC variants, the former is too slow at high resolutions. The sigma-delta converter is an efficient and simple pulse modulator and is therefore commonly used in applications requiring a high degree of precision. Converters having a resolution of up to 20 bits have previously been introduced. Like other pulse-modulating converters, the sigma-delta converter requires oversampling. As a rule, the oversampling is 64–256 times the sampling rate required according to the Nyqvist criterion. The oversampling is due to the efficiency of the forming of the frequency spectrum of the quantisation noise by the sigma-delta modulator, as well as to the aimed-at accuracy. This means that the usable bandwidth is fairly low (often 10–100 kHz), and there is need of a substantial reduction of the sampling rate on the outgoing one-bit signal. This is carried out with the aid of decimation filters taking up considerable space on the chip surface. Unlike conventional ADCs which convert each individual sample, sigma-delta converters are able to correctly transmit the frequency content of the sequence of input signal samples within the band limitation range. If the conversion of a data stream involving mutually uncorrelated measured values is to be carried out with the aid of a sigma-delta ADC, owing to the high resolution and linearity thereof, each measured value has to be fed into the sigma-delta converter in a sequence exceeding the oversampling relationship. This is to give the converter time to settle to the temporarily constant levels that each measured value represents. In such an application, the data rate therefore becomes lower than what is indicated by the oversampling relationship.

There are applications where there is need for high-resolution ADCs, but where neither conventional ADCs nor sigma-delta converters are suitably used. This may be due to reasons of costs (conventional) or speed requirements (sigma-delta). A particular instance of speed requirement is when the analogue signal consists of a great number of channels, each of which has a moderate speed and high dynamics. One solution is to let the analogue channels be multiplexed at a hurried pace between one or more rapid conventional ADCs. Rapid multiplexing of analogue signals may, however, have an adverse effect on the signal-to-noise ratio. Owing to this fact taken together with the drawbacks of rapid and high-resolution conventional ADCs, one sometimes aims at achieving an increased parallelism in the A/D conversion, involving a great number of ADCs operating at moderate speed. Each ADC is then allowed to operate on one or a small number of channels close to the source. A solution using a conventional sigma-delta ADC is not practicable, owing to the chip area required and the power consumption, primarily due to the decimation filters. By the expression "conventional sigma-delta ADC" is here meant a sigma-delta ADC operating with noise forming without zero resetting under normal operation and with reduction of the bit stream from the noise-forming modulator by means of a so-called decimation filter. If the analogue signals in addition are uncorrelated time-discrete values, the sigma-delta converter may not be able to meet the speed requirements either, since it requires a substantial settle time for uncorrelated input data, as indicated in the foregoing.

In applications involving a great number of channels and moderate resolution, use is also made of an A/D converter, which here is referred to as a voltage-to-pulse-amount converter. This converter then is a sigma-delta modulator of the first order, which is reset to zero before each new input signal period. Then, during the time of each conversion, the number of pulses of the one-bit stream is recorded. The drawback of this type consists in a time-consuming conversion needed to achieve high resolution. For instance, 14-bit accuracy requires as much as 16,384 clock periods!

However, the method is robust as regards inaccurate component values and is easily implemented in standard CMOS process technology.

SUMMARY OF THE INVENTION

Taking into consideration the problems mentioned in the foregoing, one may generally summarise in which ADC contexts a new ADC principle is desirable:

1. applications with high dynamics and uncorrelated data at average or high speed and where a low cost and/or compatibility with standard IC process technology are required;
2. applications which normally are suited for sigma-delta converters but where one does not wish to employ decimation filters;
3. high-resolution A/D conversion of a great number of parallel channels, where the total data rate is moderate or high; and
4. combinations of 1–3.

In order to suit the contexts 1–4 indicated above, the following desiderata as regards a new ADC principle may be put forward:

1. robust as regards inaccurate component values and ageing, such that no trimming is required;
2. compatible with standard CMOS IC process technology; and
3. significantly faster than a voltage-to-pulse-amount converter of corresponding resolution.

The present invention concerns a solution to the indicated problem by being designed in the manner appearing from the appended claims.

BRIEF DESCRIPTION OF THE DRAWINGS

The invention will now be explained in more detail with reference to the accompanying drawings, in which.

DETAILED DESCRIPTION OF THE DRAWINGS

Figure 1:
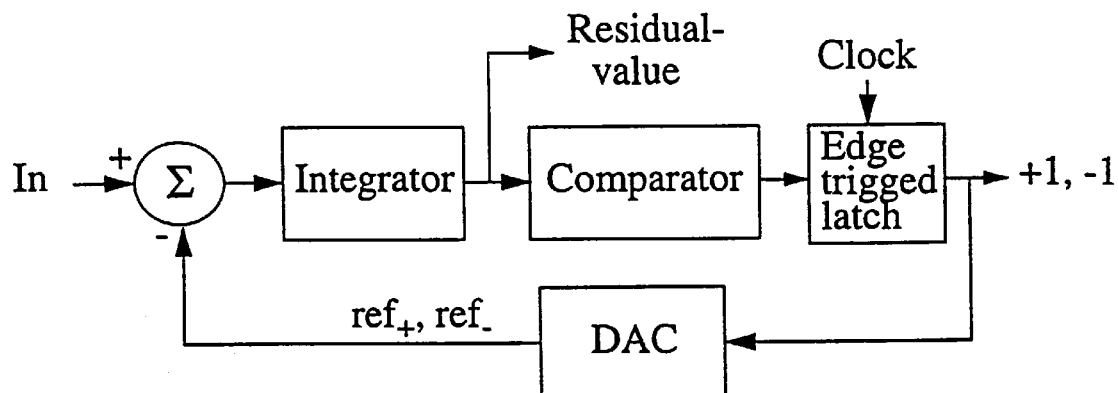
FIG. 1 shows a feedback integrator used in the invention.

The invention concerns a new ADC called Pulse Rest ADC (PR-ADC), which is developed and built round a feedback integrator, which is shown in FIG. 1. Assuming that we have an AD conversion with a resolution of n bits, where $n=n_1+n_2$. During the first $N_1=2^{n_1}$ clock periods, the $n_1$ most significant bits are recorded, and the function is identical with what has previously been described as a voltage-to-pulse-amount converter. In order to increase the resolution of the integrated signal to n bits, the remaining voltage on the integrator can be AD-converted with the resolution $n_2=n-n_1$ bits. The conversion of the residual voltage only requires an accuracy and a resolution corresponding to $n_2$ bits and may therefore be carried out in accordance with a number of conventional methods (if $n_2<8-10$).

Here and in the following, the invention is described on the basis of the assumption that the measured value, which is an input signal to the device, is in the form of a voltage. Even at the introduction to the description, it was, however, indicated that the input signal may take other forms, such as a current or a charge. When reference is made to residual voltage in the following, these references naturally bear upon the residual value of the type at issue.

It is evident that the residual voltage (the residual value) can be sampled and converted by a separate ADC suited for this purpose. However, some hardware may be saved by using existing components for this A/D conversion. The residual-voltage conversion may then be performed with the aid of:

Ramp conversion where the ramp voltage is applied to the input of the comparator. The value of the ramp voltage at the transition of the comparator then corresponds to the residual voltage.

Ramp conversion where the ramp voltage is applied via the feedback loop. The value of the ramp voltage at the transition of the comparator then gives the least significant bits at once.

Conversion according to the principle of successive approximation. By halving the feedback for each period of the following $n_2$ clock periods, the $n_2$ least significant bits are obtained at the output of the comparator, beginning at high significance.

PR-ADC is built round an integrator with high amplification. Owing to the high amplification, the input signal would, after a few clock cycles, saturate the integrator, were it not for the time-discrete negative feedback. The value of the feedback only assumes two levels ($ref_+$ and $ref_-$) whose magnitudes need not be identical. Thus, $ref_+$ increases the value of the integrator, and $ref_-$ reduces this value. In some implementations, it is possible to easily achieve three levels, the third level being no feedback at all.

The absence of feedback may be advantageous during the first clock period of the integration. The feedback value is determined just before the feedback of the comparator is carried out in a thresholding. This thresholding should be carried out round the central point of the swing of the integrator in order to optimise the signal level. The value of the feedback is so set that it can just counteract the largest input signal amplitude. A maximum input signal then gives the feedback $ref_-$ all the time, and a minimum input signal gives $ref_+$. To obtain maximum dynamic range, the amplification of the integrator should be so chosen that the integrator obtains maximum output by $\pm|ref_+-ref_-|$, which is the highest value the integrator may come to assume.

Figure 3:
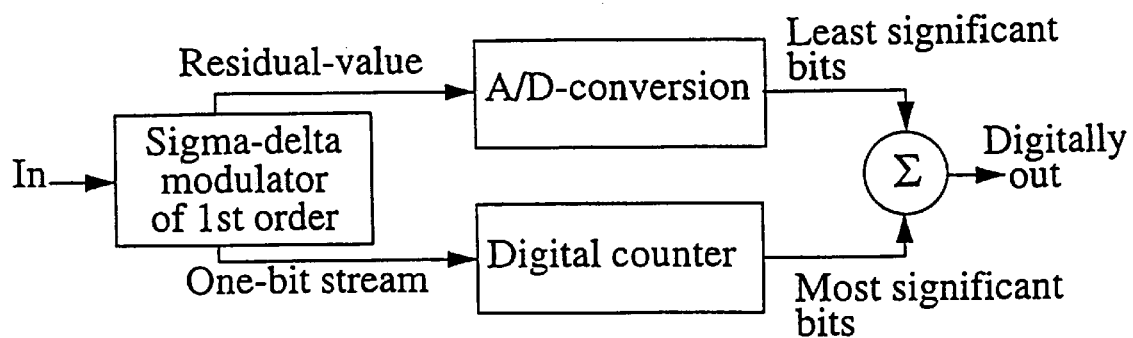
FIG. 3 illustrates the basic design of a converter according to the invention.
Figure 2:
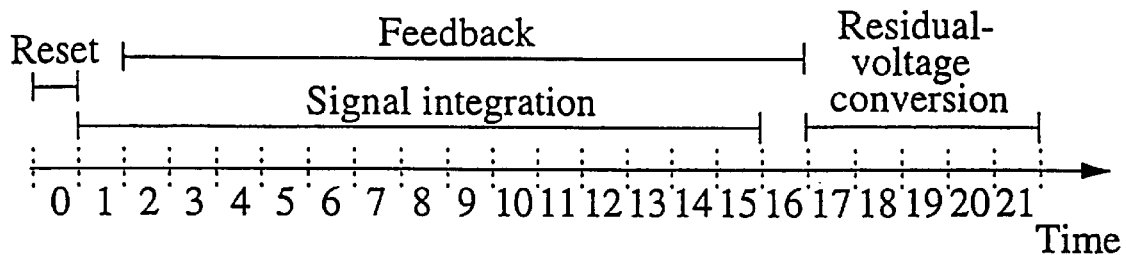
FIG. 2 illustrates the time relationships for zero resetting, signal integration, feedback and residual-voltage conversion for a converter according to the invention.
Figure 4:
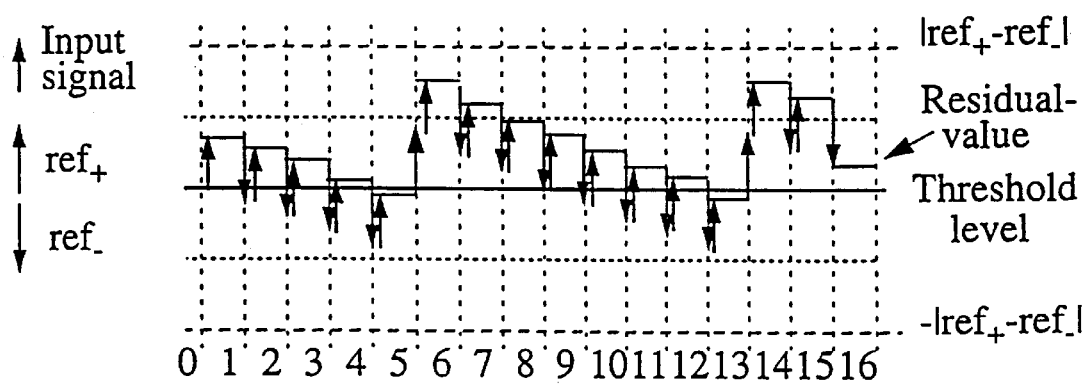
FIG. 4 illustrates the effect the feedback has on the output of a converter according to the invention, which is supplied with a constant and positive signal.

FIG. 2 shows the time relationship between the different phases during 3-bit voltage-to-pulse-amount conversion and is meant to illustrate the following general description. An $n_1+n_2$-bit PR-ADC conversion begins by resetting the integrator to zero. The first integration of the input signal should then be performed without any feedback, since there does not exist, at this stage, any previous decision data for performing meaningful feedback. Predetermined feedback is meaningless and creates an offset at the input of the PR-ADC. Such an offset may, however, be compensated for afterwards, since it is known. The integration of input signal and feedback is then allowed to continue during $N_1-2$ clock periods. A final integration is then performed without input signal in order that the residual-voltage conversion should function correctly. The value of the integrator will now be the sum of the input signal and the feedback during these $N_1$ integration cycles. This value is referred to as the residual voltage. The integral of the input signal can then be found by recording the number of ref_ feedback signals and A/D-converting the residual voltage and weighting these in digital fashion, as illustrated in FIG. 3. The number of ref_ feedback signals recorded will then determine the most significant bits, and the final value of the integrator will then determine the least significant bits. FIG. 4 illustrates the effect the feedback has on the output of the integrator during the time of a 3-bit voltage-to-pulse-amount conversion with a constant and positive input signal.

FIG. 3 hints at the possibility of having an additional complete ADC of some sort sampling and digitising the residual voltage. This method is straightforward but has its weaknesses. Thus, this method involves a considerable additional hardware requirement, and the matching between the levels of the residual voltage and the additional ADC is sensitive to component inaccuracies. However, it is not impossible to achieve this matching, since the accuracy only corresponds to the $n_2$-bit accuracy of the digitalisation of the residual voltage. The fundamental idea is that such accuracy is to be achieved without trimming for relative values between adjoining components. However, it becomes more difficult since separate blocks containing a number of components are to be matched with each other. An attractive solution would be to use existing components instead.

A first way to convert the residual voltage is by successive approximation (SA). If the feedback is so designed that ref_ and ref_+ are symmetrical and can be halved $n_2$ times, an $n_2$-bit SA conversion can be carried out. After the last integration period, the residual voltage is in the range of ref_ to ref_+ in relation to the comparator level, since no input signal was then added. For the most significant bit of the $n_2$ last bits it is now decided if the residual voltage is above or below the comparator level. The feedback is halved to ref_/2 and ref_+/2 and added to the residual voltage, such that the latter is in the range of ref_/2 to ref_+/2 during the next period. For the next bit it is now decided if this voltage is above or below the comparator level. This procedure is repeated until all the remaining bits have been decided.

In order to maintain the aimed-at accuracy in the residual-voltage conversion, the symmetry of ref_ and ref_+, as well as the halvings of ref_ and ref_+, must be kept within $n_2$ bits. The sensitivity in the halvings is, as it should, reduced by halves for each halving. During the $N_1-1$ first periods of the voltage-to-pulse-amount conversion, the symmetry is of no importance, but the difference between ref_ and ref_+ must, however, be kept constant during the entire conversion.

Halving of the feedback results in the most rapid settling towards the threshold level of the comparator and a minimum complexity when it comes to weighting the out-going bit stream to a digital word. However, halving does not give tolerance as regards incorrect comparator decisions. If an error is made in a feedback cycle as a result of noise or interferences when the level of the integrator is close to the threshold level, the residual-voltage level can never recover. Subsequent feedback can then never bring the value of the integrator down to the threshold level again. Consequently, interferences, noise and settling properties of the comparator have an effect during all the $n_2$ feedback cycles.

If the feedback instead is not reduced as rapidly, incorrect comparator decisions can be rectified at an early stage. However, this has its costs in terms of conversion rate and complexity. The conversion time is reduced since, at a reasonable choice of the relative reduction of the feedback, an extra feedback cycle is required if one is to obtain the same resolution. The complexity is increased, since the outgoing bit stream does not directly correspond to the bits of the digital word. Each bit in the bit stream corresponds to an associated feedback value. This value is a multi-bit digital word, which has to be added to previously-converted bits. The accuracy requirement placed on the feedback is not altered in relation to the case involving halving. However, the feedback value has to be known. For the sake of simplicity, it is assumed, in the following description, that the feedback is halved.

There are different ways of performing the successively decreasing feedback. In an extreme case, the different feedback levels are determined by weighted capacitances only. This solution has the great disadvantage of requiring a substantial chip area owing to large capacitance ratios. A small chip area requirement should be aimed at, since the idea is to implement an array of a great number of parallel converters. In another extreme case, the feedback levels are determined by voltage references only. These reference voltages have to be created by a reference ladder common to the whole array. The major disadvantage of this solution is that the total capacitive load consists of the whole feedback capacitance of all the parallel converters. As a result, a low-resistive resistance ladder is required, since a short time constant is needed if one is to obtain rapid and, hence, accurate settling during a clock period. A low resistance in turn involves a higher power consumption, which is a disadvantage.

A cross between these two extreme solutions would be to create the successively decreasing feedback by resorting to a combination of weighted capacitances and a resistance ladder. It is possible to have weighted capacitances take care of the most significant feedback signals, while the lowest-weighted capacitance is connected to a resistance ladder in order to achieve the least significant feedback signals. In this way, one avoids large capacitance ratios while obtaining a low power consumption.

Figure 5:
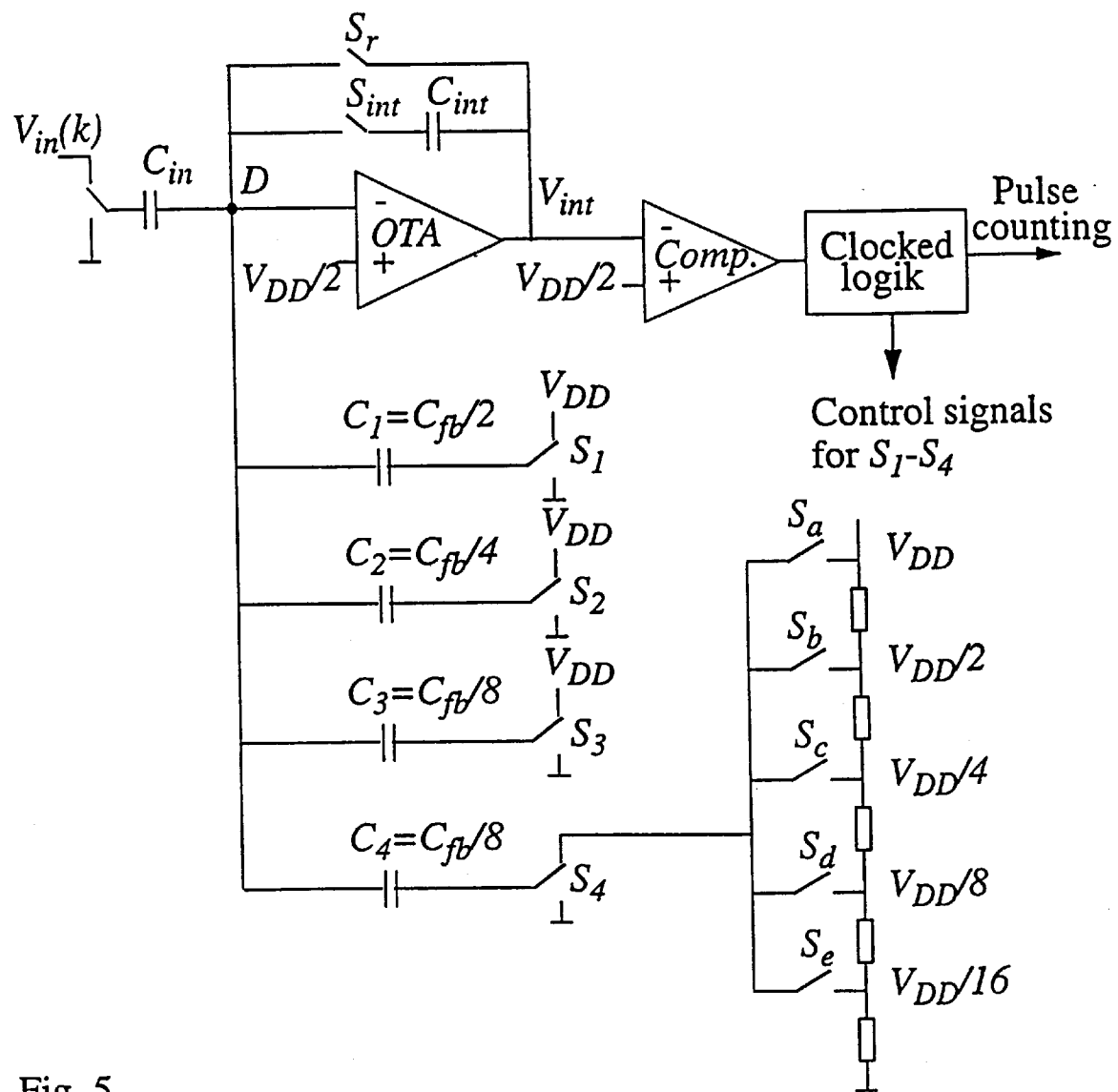
FIG. 5 illustrates the analogue part of a converter according to the invention, having a chopping input for residual-voltage conversion with successive approximation.

The implementation of the analogue part of a PR-ADC with chopping input may be of the type illustrated in FIG. 5. During the initial zero resetting, the switches $S_r$ and $S_{int}$ are both conductive, whereupon $C_{int}$ loses its charge. During the subsequent integration, the switches $S_r$ and $S_{int}$ alternate, such that they are never conductive at the same time. The switch takes place as the input signal is chopped, which entails that the charge $C_{in} \times V_{in}(k)$ is accumulated to $C_{int}$ in the clock period k. In the same manner, the feedback is accumulated by chopping the capacitances $C_1-C_4$ with the aid of the switches $S_1-S_4$ between supply voltage $V_{DD}$ and earth. The feedback sign (ref_+ or ref_) is determined by the phase of this chopping. In turn, the phase depends on the decision of the comparator. If, during the clock period, one switches from $V_{DD}$ to earth, ref_+ is obtained at the output of the integrator. In similar fashion, ref_ is obtained when switching from earth to $V_{DD}$. The situation with no feedback at all is solved by not chopping, i.e. fixing the switches, suitably to earth.

In the residual-voltage conversion, the feedback is halved by fixing the switches $S_1-S_3$ one by one, beginning with $S_1$. However, $S_4$ is not fixed, but the voltage $V_4$ is instead reduced. By connecting one of the switches $S_a-S_e$ in the order $S_a$ to $S_e$, $V_4$ is halved for every step. The unspecified, clocked logic after the comparator converts the decision of the latter to control signals for the switches, depending on the current stage of the PR conversion.

Another way to convert the residual voltage is by making comparisons with a ramp voltage. The value of the residual voltage can be determined by comparing it with an applied ramp voltage, which is allowed to sweep over the voltage range of the residual voltage. When the ramp voltage has attained the level of the residual voltage, the comparator switches over. Since the ramp voltage is presumed to be known, its value at that time can be converted to a digital value, which then also corresponds to the value of the residual voltage. The ramp voltage can be applied as the threshold level of the comparator or through the feedback loop, depending on the construction thereof. It may be advantageous to apply the ramp voltage through the feedback, since the ramp voltage is then exposed to the same amplification through the integrator as is the feedback. The adaptation of the swing of the ramp voltage is therefore simplified, since this amplification need not be compensated for. The adaptation is then obtained if the feedback levels are the extreme values of the ramp voltage. High-resolution ramp conversion takes a long time, and should therefore be avoided. It should nevertheless be fairly easy to achieve the required accuracy.

As regards other properties of the converter, it is of no importance to the voltage-to-frequency conversion if the input signal does not have symmetrical swing, since the feedback levels then need not be symmetrical and can be adapted to the current input signal range. However, problems arise if the residual-voltage digitalisation is carried out with an SA conversion in the same hardware, since this requires symmetrical feedback. If SA conversion is nevertheless preferred, the feedback level differences have to be maintained when the feedback is shifted to symmetry. In the case of ramp conversion and external ADCs, the residual-voltage digitalisation is not rendered more complicated by the unsymmetrical swing of the input signal.

The switching point of the comparator is not critical. Variations thereof do not introduce any other errors than an equivalent offset at the input of the PR-ADC in an internal SA conversion. However, variations of the switching point of the comparator make themselves felt in the voltage range of the residual voltage, whose offset varies according to the switching point. If use is made of ramp conversion or an additional ADC, one has to make sure that the residual voltage falls within the range of the ramp voltage or the ADC.

An integrator that functions poorly owing to e.g. an operational amplifier with low amplification and/or long settle time affects the integration during the $n_1$ most significant bits. The integrator operates with the whole input signal, and considerable errors can therefore be stored if added in an unfortunate manner. Thus, high requirements must be placed on the integrator, which as a result becomes a key component.

As to the conversion time $t_c$ between consecutive input signals, it is made up of the sum of the time for the voltage-to-pulse-amount conversion $t_1$ and the time for the residual-voltage conversion $t_2$. If no pipelining is employed, $t_c$ is the total time per conversion of a signal. Further, $t_1$ is proportional to the resolution, i.e. $t_1$ is the time for $2^{n_1}$ clock periods, but $t_2$ depends on the conversion method employed. If an extra ADC is used for sampling the residual voltage, pipelining may be employed. If so, the conversion of the next sample may begin while the preceding residual-voltage conversion is carried out. Then, $t_2$ can be reduced to one clock period, if the conversion time for the extra ADC is shorter than $t_1$.

When the existing hardware is employed, no pipelining can be carried out, and $t_2$ is the time for the actual residual-value conversion. If SA conversion is employed, $t_2$ is the time for $n_2$ clock periods. If use is made of ramp conversion, also $t_2$ is proportional to $2^{n_2}$. With the exception of the last-mentioned ramp conversion, when $t_2$ may be in the order of $t_1$, $t_2$ normally is negligible in comparison with $t_1$.

As mentioned in the foregoing, the read-out of image-producing sensors is an example of a suitable application of the invention. A sensor array comprising 256×256 bridge-connected bolometer sensors for IR use may, for instance, be read out periodically with the period time 20 ms. The sensor measurements to be read out reflect a voltage change caused by a resistance change, which in turn is due to a temperature change with respect to incoming IR radiation. The sensor measurements therefore have a very small signal amplitude, which is superimposed on large individual offsets of each detector. The relationship between offset and signal amplitude of the aimed-at temperature sensitivity requires, in this example, a resolution of 16 bits. During each period, the sensor measurements may be allowed to be momentaneously sampled or be averaged, or something in between.

Owing to the low signal levels, high requirements are placed on low-noise read-out in order to cope with the high signal-to-noise ratio (SNR). As a result, the bandwidth of the measurement must be kept as low as possible. As much averaging as possible is, therefore, preferable. Neither should the analogue signal be transported over long distances before amplification and analog-to-digital conversion take place. Long signal transportations involve lines picking up interferences. In addition, there arise differences in reference levels. Also, the great number of elements entails that each separate detector element may contain very little electronics and that a very small power consumption may be allowed in this electronics.

The literature describes various methods of reading out signals from an array of IR detectors. However, there is not much material published on read-out from arrays of IR detectors made up of resistance bolometers. The most common solution involves analogue multiplexing by rows and columns of each or but a few elements at a time to preamplifiers and further analogue signal transport on to an external A/D converter. However, this solution has the problems discussed in the foregoing regarding broadband signal transport of analogue data. When mass-produced, this solution is expensive, since it requires non-standard process technology and trimming of the A/D converters.

In a method for which we have previously applied for patent protection in Swedish Patent Application 9400239-1, this problem is solved by having the resistive detector form part of an RC oscillator as frequency-determining component. The output of the oscillator then is a stream of digital pulses, which means that the oscillator performs an analog-to-digital conversion. The frequency of the oscillator is then used as a measure of the detected quantity. The noise in the detector and the oscillator will then be averaged during the time that the frequency of the oscillator is measured and will hence be suppressed. This solution is asynchronous, and one may therefore imagine that the oscillators may affect each other's transition and thus cause a frequency noise. The read-out of the frequency of the oscillators may be regarded as solved, but nevertheless is not trivial.

Figure 6:
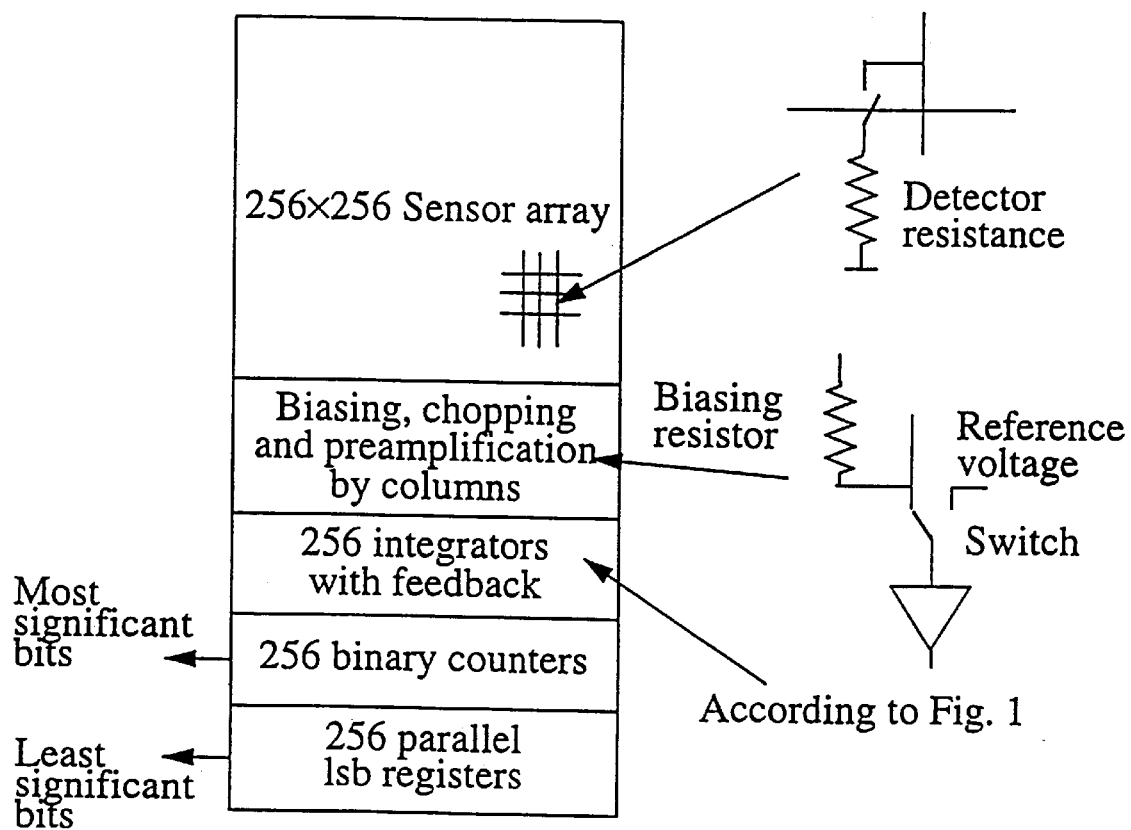
FIG. 6 illustrates the basic design of a sensor device having an analog-to-digital converter according to the invention.

Instead of the methods indicated above, use can be made of the present two-stage analog-to-digital converter PR-ADC. The method requires read-out by rows, since the hardware requirement of a PR-ADC is too considerable to be contained at each detector element. The time of each read-out and A/D conversion then is barely 78 µs, assuming that there are two rows of reference detectors, apart from 256 sensor rows. The maximum clock frequency is assessed to be approximately 5 MHz, since accurate oscillation of analogue values is required. This sets an upper limit of 8 bits for the resolution of the voltage-to-pulse-amount conversion, which requires 256 clock periods plus one period for initial zero resetting. The remaining eight bits then have to be obtained from an ordinary A/D conversion of the residual value of the integrator. An internal SA conversion then requires another 8 clock periods. The selection of a new sensor row is carried out during the internal SA conversion, such that no extra clock periods are required for settling of multiplexors and preamplifiers. All in all, 265 clock periods are required, resulting in a clock frequency of 3.4185 MHz. The structure is illustrated in FIG. 6.

Like the method involving oscillators, the new solution combines integration and A/D conversion. Approximately, the integration time equals the read-out time for one row. The method is synchronous, such that transients and interferences have time to fade away between the clock flanks where the decisions are made. Interferences therebetween do not affect the results. The analogue signal paths are fairly short, and preamplification is performed at an early stage. PR-ADC is compatible with standard CMOS process technology. If a chopped preamplifier is used for reducing the 1/f-noise of the MOS transistors, this easily accessible and inexpensive process technology may thus be employed. The chip area required is modest with a chopped preamplifier stage, a summing integrator, a digital 8-bit msb counter, and a digital 8-bit lsb register per sensor column. The capacitances of the preamplifier and the summing-up integrator will dominate the silicon surface in these stages with a standard CMOS process.

The foregoing description is focused on the application of the invention in arrays of detectors. Another demanding application concerns audio products. Sigma-delta converters are often used in DAT players (Digital Audio Tape) in audio contexts. The quantisation noise from these may, for certain input signals, contain weak but audible and disturbing tones or be subjected to a slow modulation. These phenomena orginate from limit cycles which arise in the feed back loop of the sigma-delta converter as a result of a coarse quantisation. Usually, a dither signal is supplied to the feedback loop in order to break up such sequences. Nevertheless, it cannot be guaranteed that no such audible and disturbing sequences arise. A PR-ADC, on the other hand, has no such tendencies, since it is reset to zero before each sample. When use is made of a PR-ADC, there is no need of any decimation filter, which saves costs. The conversion rate of a PR-ADC is in the same order as that of a sigma-delta converter. Since it further is possible to achieve a linearity on a par with that of the sigma-delta converters without trimming, the PR-ADC is a good alternative also in audio contexts.

We claim:

1. A periodically integrating analog-to-digital converter comprising a measured-value-to-pulse-amount converter which includes a sigma-delta converter of a first order that is reset to zero before each new period and a digital counter for counting a number of feedback signals of known reference value in the measured-value-to-pulse-amount converter, which is a rough measure of its input signal, a residual-value converter that converts the residual value of the measured-value-to-pulse-amount converter at the end of the period to a digital value, and an adder which adds the digital value to the output signal from the digital counter, resulting in a more accurate measure of the input signal.

2. The device as claimed in claim 1, wherein the residual-value converter and the measured-value-to-pulse-amount converter share at least one component.

3. The device as claimed in claim 1, wherein the residual-value converter is a converter of the type successive approximation, whose feedback involves successively decreasing levels.

4. The device as claimed in claim 1, wherein the residual-value converter makes comparison with a known ramp value.

5. A sensor device having an array of detectors arranged in columns adapted to be read out by column in parallel, the device comprising a periodically integrating analog-to-digital converter having a measured-value-to-pulse-amount converter, including a sigma-delta converter of a first order that is reset to zero before each new period, which includes a digital counter for counting a number of feedback signals of a known reference value in the measured-value-to-pulse-amount converter, which in turn is a rough measure of its input signal, a residual-value converter that converts the residual value of the measured-value-to-pulse-amount converter at the end of the period to a digital value, and an adder which adds the digital value to the output signal from the digital counter, resulting in a more accurate measure of the input signal, wherein the residual-value converter and the measured-value-to-pulse-amount converter share at least one component.

6. The sensor device as claimed in claim 1, wherein the detectors are infrared radiation detectors.

7. The sensor device as claimed in claim 6, wherein the detectors are resistance bolometers.

* * * * *